United States Patent [19]

Haller et al.

[11] Patent Number: 5,138,707
[45] Date of Patent: Aug. 11, 1992

[54] METHOD OF OPERATING A TIMER IN A DIGITAL DATA PROCESSING SYSTEM

[75] Inventors: Wilhelm Haller, Remshalden; Johann Hajdu, Boeblingen; Klaus J. Getzlaff, Schoenaich, all of Fed. Rep. of Germany

[73] Assignee: International Business Machines Corporation, Armonk, N.Y.

[21] Appl. No.: 406,628

[22] Filed: Sep. 13, 1989

[30] Foreign Application Priority Data

Jan. 5, 1989 [DE] Fed. Rep. of Germany ..... 89100112

[51] Int. Cl.⁵ .............. G06F 7/00; G04B 17/20; G11C 19/00
[52] U.S. Cl. .................. 395/550; 368/202; 377/69
[58] Field of Search ........... 364/271.1, 271.2, 271.4; 395/550; 368/47, 202; 377/69

[56] References Cited

U.S. PATENT DOCUMENTS

| 4,321,520 | 3/1982 | Veda et al. ................ 368/202 |
| 4,448,543 | 5/1984 | Vail ............................ 368/202 |
| 4,502,790 | 3/1985 | Yokoyama .................. 368/202 |
| 4,537,515 | 8/1985 | Dinger et al. ............... 368/202 |
| 4,582,434 | 4/1986 | Plangger et al. ............. 368/47 |
| 4,650,344 | 3/1987 | Allgaier et al. .............. 368/202 |
| 4,779,248 | 10/1988 | Odagiri et al. ............. 368/202 |
| 4,899,117 | 2/1990 | Vig ............................. 368/202 |
| 4,951,301 | 8/1990 | Zulian ........................ 377/54 |

FOREIGN PATENT DOCUMENTS 83301485 11/1980 European Pat. Off.
87107952 12/1987 European Pat. Off.

OTHER PUBLICATIONS

Electronics & Wireless World, vol. 92, No. 1607, Sep. 1986, pp. 18-23, London, GB; M. Catherwood, "Microcontroller Chip Includes Peripherals".

Primary Examiner—Stuart S. Levy
Assistant Examiner—Christopher R. Glembocki
Attorney, Agent, or Firm—Richard E. Bee; Arthur J. Samodovitz

[57] ABSTRACT

A method of operating a timer mechanism in a digital data processing system is described in which the contents of at least one timer register is updated by a predetermined time increment during each of successive periodic update cycles. Each update cycle includes a predetermined number of operating cycles of the data processing system. During each update cycle, the contents of an adjustment register is circularly shifted by one bit position and if the bit value at a particular position in this adjustment register has a predetermined binary value during an update cycle, then actual updating of the timer register is omitted during a related update cycle.

12 Claims, 4 Drawing Sheets

METHOD OF OPERATING A TIMER IN A DIGITAL DATA PROCESSING SYSTEM

DESCRIPTION

1. Technical Field

This invention relates to a method of operating a timer mechanism in a digital data processing system wherein the timer mechanism is periodically updated by a predetermined time increment.

2. Background of the Invention

One or more timer mechanisms or timers are sometimes implemented in a digital computer or other digital data processing system for various purposes such as to indicate the time of day, to count predetermined time periods from their beginning down to their end, to compare various time functions with real time, and so on.

In general, it is not desirable to provide special clock circuits, such as specially adapted oscillators, for this purpose if it can be avoided. It is more desirable to use the operating cycle timing signals or clock pulses which are already available in the data processing system. But to base the operation of such timers on the operating cycle or clock cycle of the data processing system requires that the time increment used for updating the timers must be a predetermined multiple of the operating cycle time of the data processor. For example, if the time increment with which the timers are to be updated is one microsecond, there must exist an integer multiple of the operating cycle time which reoccurs exactly every one microsecond. This integer or whole number is equal to the number of operating cycles which are required in order to develop each update signal. If the update time increment is one microsecond and updating requires ten operating cycles, this can only function precisely if the operating cycle time is exactly 100 nanoseconds. Otherwise, updating would be inaccurate.

For a number of reasons, however, such a precise relationship suitable for updating the timers is not always available. As a consequence of specific requirements to be met by the data processor or its basic clock generating oscillator, the operating cycle times of the processor may have "odd" values from which suitable time increments cannot be derived by mere multiplication by an integer or whole number. The operating cycle time may be, for example, 99 or 36 nanoseconds. Thus, a different approach is necessary to end up with update time increments of exactly one microsecond or some other desired value. Also, circumstances may arise, for example, during development or for different uses of data processing systems, in which it is advisable to change the operating cycle time and nevertheless it is desirable that the timer implementation be such that it can be readily adjusted to such change.

SUMMARY OF THE INVENTION

This invention provides a method for operating a timer mechanism of the aforementioned type which easily can be adjusted to various operating cycle times. In particular, the timer mechanism is readily programmable to adapt it to various operating cycle times within a relatively wide range.

In accordance with the present invention, there is provided a method of operating a timer mechanism in a digital data processing system wherein it is desired to periodically update the timer mechanism by a predetermined time increment. This method uses operating cycle timing signals normally produced by the data processing system for controlling data processing operations to control periodic updating of the timer mechanism even though the operating cycle time interval is not a submultiple of the desired predetermined time increment. This is accomplished by intermittently suppressing the updating of the timer mechanism by these operating cycle timing signals for adjusting the time value in the timer mechanism so that the time value error is always less than the desired predetermined update time increment for the timer mechanism.

In a representative embodiment, an adjustment bit pattern is provided in an adjustment register and the contents of this adjustment register are circularly shifted by one bit position during each timer update cycle. This update cycle includes a predetermined number of operating cycles of the data processor. If the bit value at a particular position in this adjustment register has a predetermined binary value (for example, binary one value), this indicates that update suppression is desired and actual updating of the timer mechanism is suppressed or omitted for one update cycle.

This embodiment includes, as part of a series of update cycles, a check of the adjustment register, the contents of which are circularly shifted one bit position during each update cycle. By circularly shifted is meant that the bit shifted out of one end of the register is inserted back into the other end of the register. In response to a particular binary value at a particular bit position, for example, a one value in the leftmost bit position, the circuits associated with the adjustment register control the execution or omission of a particular update operation. If, for example, during a particular update cycle, a binary value of one is found in the leftmost bit position, this may be defined to indicate that either the concurrent or the next update cycle should be a "suppress" cycle during which actual updating of the timer is omitted in order to obtain a certain time adjustment, namely, an adjustment equal to the duration of one update cycle.

For example, an adjustment is necessary for the case where the update time increment is one microsecond and the number of operating cycles necessary for one update cycle is ten, if the operating cycle is 99 nanoseconds in duration instead of 100 nanoseconds. The cumulative error occurring during each update cycle would be ten nanoseconds, since ten operating cycles are needed for one update cycle. On the other hand, one update cycle needing ten operating cycles lasts for 990 nanoseconds. Thus, if 99 update cycles are carried out normally and during one further update cycle actual updating is omitted or suppressed, then after a total of 100 update cycles the actual elapsed time would be 99,000 nanoseconds or 99 microseconds, involving not 100 but rather 99 updates. This is exactly the same as it would be in the case of 99 update cycles, each involving ten operating cycles of 100 nanoseconds each.

Without the suppressed update cycle, there would be 100 updates of the timer, causing the timer to have a face value of 100 microseconds. Actually, however, the elapsed time would be only 99 microseconds. By suppressing one out of the 100 updates, the timer will be updated 99 times and will show a face value of 99 microseconds, which is in agreement with the actual elapsed time. Suppressing the one updating allows the real world time to catch up with the time shown on the face of the timer.

Thus, it is seen that, over a certain length of time, by properly omitting the execution of timer updates during predetermined ones of the update cycles, adjustment or correction can be achieved. The maximum time error which can accumulate between adjustments will always be less than the time increment used for updating the timer. In the above example, the maximum error will always be less than one microsecond. Further, since the control of execution or omission of updates during particular update cycles depends on the bit value at a particular position in the adjustment register, adjustment can readily be programmed to meet various different situations.

For a better understanding of the present invention, together with other and further advantages and features thereof, reference is made to the following description taken in connection with the accompanying drawings, the scope of the invention being pointed out in the appended claims.

BRIEF DESCRIPTION OF THE DRAWINGS

Referring to the drawings.

Figure 1:
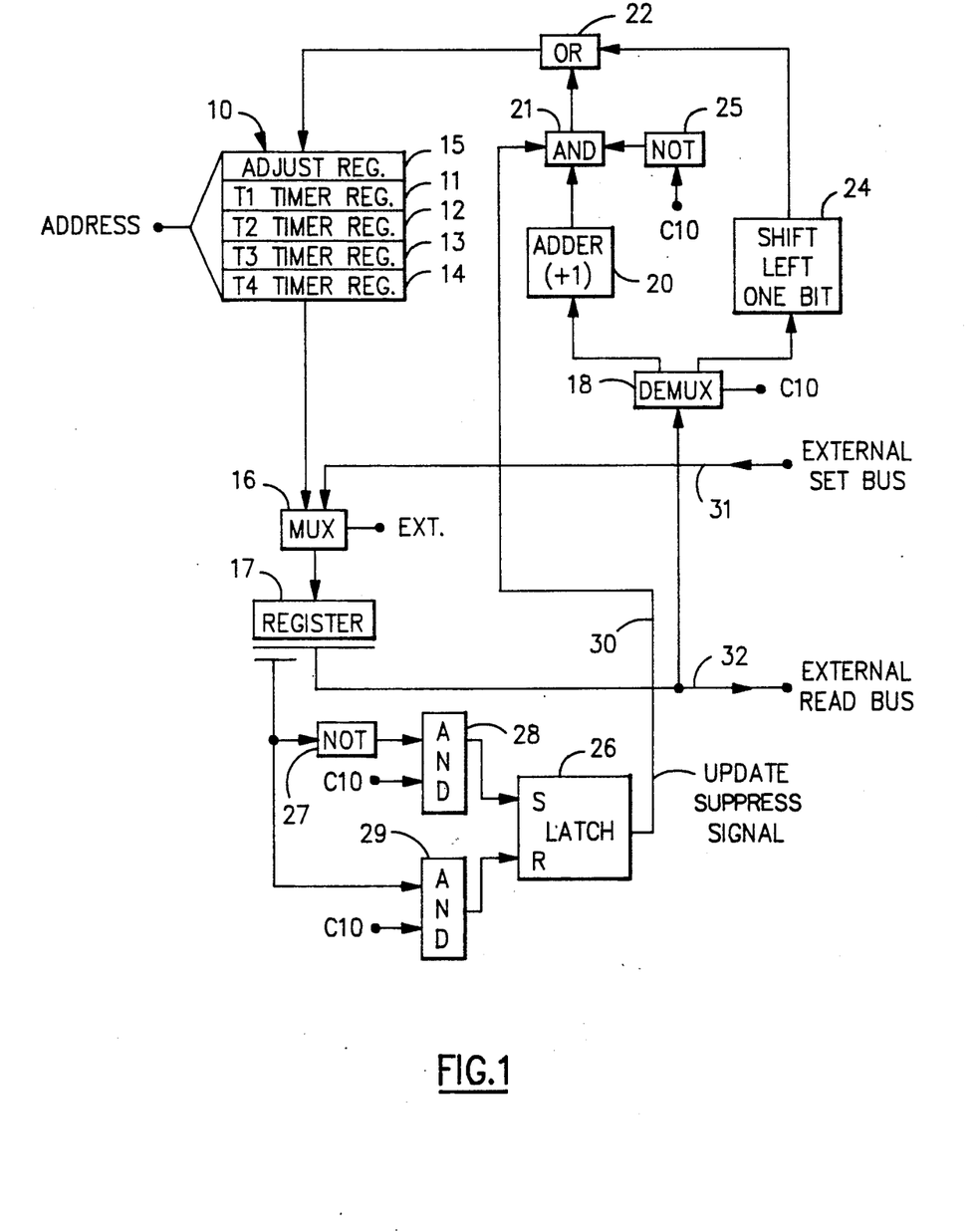
FIG. 1 is a block diagram showing a first embodiment of a timer mechanism constructed in accordance with the present invention.

DESCRIPTION OF THE FIG. 1 TIMER MECHANISM

Referring to FIG. 1, there is shown a first embodiment of a timer mechanism constructed in accordance with the present invention. This mechanism includes a register array 10 having four timer registers 11, 12, 13 and 14 and an adjustment register 15. These timer registers are used to provide various different timing functions such as a time of day clock, a time interval counter, a processor timer function, a clock comparator function and so on. These registers are continually updated to contain the current time value for the associated timing function. For example, if the T1 timer register is used to provide a time of day clock, then it is continually updated to contain a value representing the current time of day. Each of these timer registers 11–14 is updated once during each update cycle. If, for example, the T1 timer register is used to indicate the time of day, then once during each update cycle a time increment corresponding to the length of time required for one update cycle is added to the contents of the T1 timer register.

Figure 2:
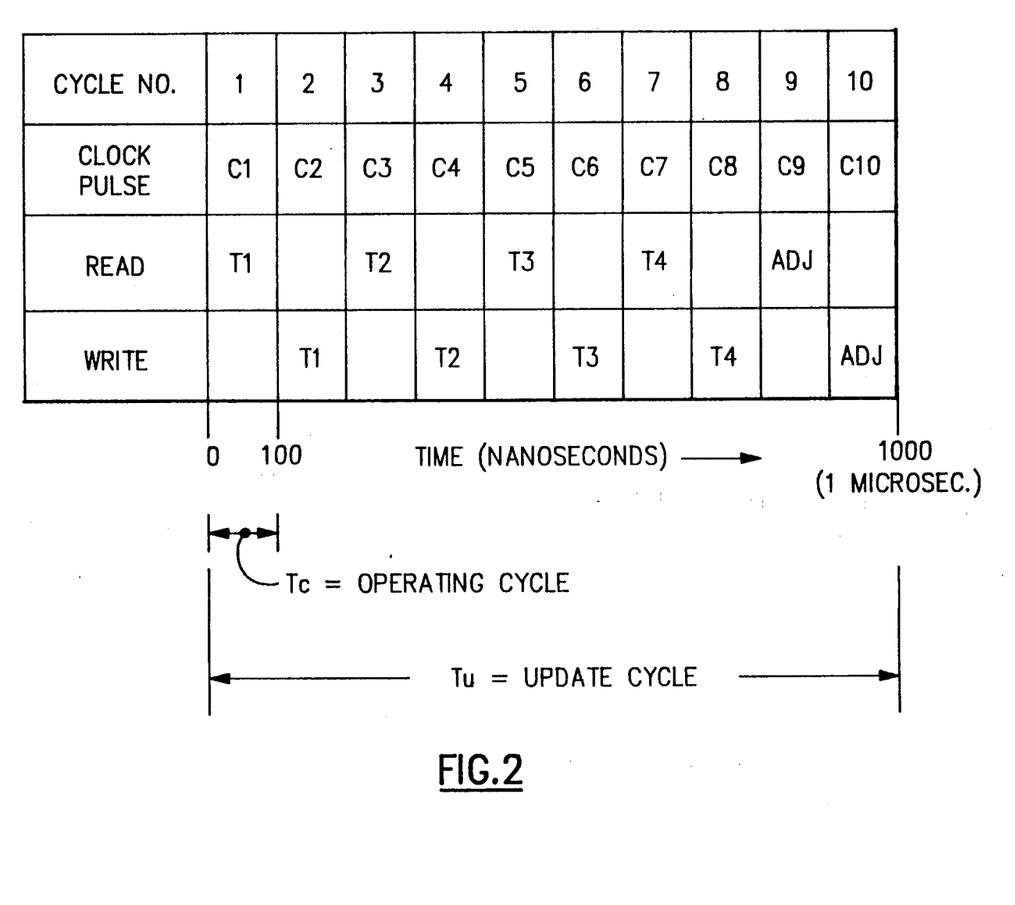
FIG. 2 is a timing chart used in explaining the operation of the FIG. 1 embodiment.

This relationship is shown in the timing chart of FIG. 2, which also shows the relationship between update cycles and data processor operating cycles. The symbol Tc denotes a data processor operating cycle and the symbol Tu represents a timer update cycle. The data processor operating cycles are numbered as 1, 2, 3, etc. For sake of example, it is assumed that each data processor operating cycle has a cycle length Tc of 100 nanoseconds and that one timer update cycle is comprised of ten data processor operating cycles. Thus, the length of time Tu for one update cycle is assumed to be 1,000 nanoseconds or one microsecond. The timing pulses or clock pulses for the different operating cycles are identified as C1, C2, C3, etc.

As indicated in FIG. 2, the contents of the T1 timer register are read out of the array 10 during the occurrence of the C1 clock pulse, are updated and are written back into the T1 timer register during the occurrence of clock pulse C2. When read out of the array 10, the multibit data value in the T1 timer register is supplied by way of multiplexer 16 to a multibit buffer register 17, as is shown in FIG. 1. The data value in register 17 is supplied by way of a demultiplexer 18 to an adder 20. Adder 20 adds a predetermined numerical value (in this example, a value of one) to the data value received from register 17 to produce at its output an updated data value corresponding to the sum of the data value received from register 17 plus the predetermined numerical value added by the adder 20. This updated data value is supplied by way of AND circuit 21 and OR circuit 22 to the data input of the array 10. During clock pulse C2, this updated data value is written back into the T1 timer register of array 10.

A similar updating function is provided for each of the other timer registers during its respective portion of the update cycle. Thus, the data value in the T2 register is read out during clock pulse C3 and after being updated by adder 20, is written back into the T2 register during clock pulse C4. Thus, as seen from FIG. 2, each timer register is updated once during each update cycle. There are, of course, an endless series of such update cycles so that each timer register is continually being updated.

In the present example, it is assumed that the time value in each of the timer registers is expressed in terms of microseconds. Adder 20 adds a count value of one for each update. This count value of one represents a time value of one microsecond. This corresponds to the time period of one update cycle, which is also one microsecond. Thus, during each one microsecond update cycle, each timer register is updated by a value of one microsecond.

If the time increment corresponding to the duration of the update cycle is developed from the operating cycle time Tc, it should have a value which easily can be related to the time increments to be added to the timer registers each update cycle. In other words, if the update time increment to be added to a timer register is one microsecond, then it is necessary that the update cycle time Tu also is one microsecond. This can be readily achieved if Tu is a multiple of the operating cycle time Tc or, in other words, if Tu is equal to Nu times Tc, where Nu is a whole number or integer. Nu is, of course, the number of operating cycles per update cycle.

This is the situation depicted in FIG. 2 where an update cycle includes ten operating cycles, each having an operating cycle time Tc of 100 nanoseconds, resulting in an update cycle time Tu of 1,000 nanoseconds or one microsecond. The fact that in this example ten operating cycles are included in each update cycle results from the fact that one read operation and one write operation are needed for each of the five registers in the array 10 for one update cycle. If these relations as shown in FIG. 2 are true, then no adjustment is really needed and the adjustment register 15 would not actually be used in such case.

It may be, however, that the processor operating cycle time Tc for other reasons has an "odd" value. Let it be assumed, for example, that Tc is equal to 99 nanoseconds. This "odd" value of Tc is referred to herein as Tc'. Thus, the update time increment accumulated after 10 operating cycles is Tu' and is equal to 990 nanoseconds, resulting in an error $\Delta T = (Tu-Tu') = 10$ nanoseconds per update cycle.

Without any adjustment, after 99 update cycles, each including 10 operating cycles of 99 nanoseconds each, this error will have accumulated to a total of 99 times 10 or 990 nanoseconds, which actually is equal to one update cycle time period Tu'. Thus, an adjustment for elimination of this error will be achieved if after 99 update cycles, each including one update operation, actual updating of the timer is omitted during one further update cycle. This means that 99 actual updates of the timer will have occurred after a total time of 100 modified update cycle time periods Tu'. This total time period is 99 microseconds. Since 99 time increments, each corresponding to one microsecond, will have been added to a particular timer register during this time interval, this means that adjustment to recover perfect accuracy is made after 100 update cycles if updating is omitted during one of them. This adjustment is controlled by the contents of the adjustment register 15 in the array 10.

Suppose the adjustment register 15 has an adjustment pattern field of 100 bits, of which the leftmost bit has a binary one value, with the other bits all having binary zero values. If the contents of this adjustment register are circularly shifted to the left by one bit position during each update cycle and the leftmost bit shifted out of the register is written back into it again in the rightmost bit position, then the particular bit having the binary one value will reappear in the leftmost bit position of the adjustment pattern field once every 100 update cycles. The binary one value of the bit at this particular bit position of the adjustment register 15 thus can be used to control the adjustment process. If, for example, actual updating of the timer registers is omitted when a binary one value appears at the leftmost bit position of the adjustment register 15, this occurs once in every 100 update cycles and provides exact adjustment or correction of the timer time values. A bit having a binary one value in the adjustment field pattern will be referred to herein as a "suppress" bit.

Referring to FIG. 1, the manner of accomplishing this time adjustment or correction is done by reading the contents of the adjustment register 15 out of the array 10 during clock pulse C9 of each update cycle. This adjustment pattern field is read out from the adjustment register 15 and loaded into the buffer register 17. During the C10 clock pulse of each update cycle, this adjustment pattern field in register 17 is supplied by way of demultiplexer 18 to a shift left one bit shifter circuit 24 during the C10 clock pulse interval. This C10 clock pulse serves to switch the demultiplexer 18 to its righthand position to pass the contents of the register 17 to the bit shifter 24. This C10 clock pulse is also supplied to a NOT circuit 25 to disable AND circuit 21 to disable or prevent the passage of any data from the adder 20 to the data input of array 10.

Bit shifter 24 serves to circularly shift the adjustment pattern field one bit position to the left, with the bit shifted out of the left side of the shifter being inserted back into the rightmost bit position of the shifter 24. The shifted adjustment pattern appearing at the output of shifter 24 is supplied by way of OR circuit 22 to the data input of array 10 and is written into the adjustment register 15 during the occurrence of the C10 clock pulse. In this manner, the adjustment pattern in register 15 is, in effect, circularly shifted to the left by one bit position for each occurrence of a timer update cycle.

The leftmost bit position in the adjustment register 15 is used to control the suppression of the timer updates. Actual suppression is accomplished by means of a set-reset latch circuit 26. During clock pulse C9, the adjustment pattern in register 15 is loaded into register 17. The leftmost bit in this pattern, as it resides in register 17, is supplied by way of a NOT circuit 27 to a first AND circuit 28 and is supplied directly to a second AND circuit 29. The output of AND 28 is connected to the set (S) input of latch 26 and the output of AND 29 is connected to the reset (R) input of latch 26.

If the leftmost bit position in register 17 contains a binary zero value (the no suppress value), this is inverted to a binary one value by NOT 27 to enable AND 28. This enables the C10 clock pulse to be supplied to the set input of latch 26 to place same in its set condition. This activates or places a binary one value on the latch output line 30.

If, on the other hand, the leftmost bit position in register 17 has a binary one value (the suppress value), then AND 28 is disabled and the second AND 29 is enabled. As a consequence, the C10 clock pulse is supplied by way of the second AND 29 to the reset (R) input of latch 26. This resets the latch 26 which, in turn, produces a binary zero value on the latch output line 30.

The signal level on the latch output line 30 controls the making or not making of the timer updates during the ensuing update cycle. A binary value of one enables the AND circuit 21 and thus enables the updating of the T1-T4 timer registers during the C1-C8 clock pulse intervals. A binary zero value on latch output line 30, on the other hand, disables the AND circuit 21 and prevents or suppresses the updating of the T1-T4 timer registers during the update cycle immediately following the reset of latch 26. Thus, a binary zero value on latch output line 30 constitutes an update suppress signal. For the example being considered, this update suppress signal occurs for one update cycle out of every 100 such update cycles.

The embodiment of FIG. 1 also includes an external set bus 31 which is coupled by way of multiplexer 16 to the buffer register 17 if the EXT (external) control line for multiplexer 16 is activated. If the EXT line is not active, multiplexer 16 is set to its lefthand position to pass the output data from array 10 to the register 17. This external set bus 31 enables a predetermined data value to be loaded into the register 17 and thereafter written into a selected one of the array registers 11-15. Among other things, this enables initial starting values to be programmed into different ones of the array registers 11-15. The embodiment of FIG. 1 also includes an external read bus 32 coupled to the output of the buffer register 17. This bus 32 enables the time values in the different timer registers to be read out and used by other units in the data processing system.

Since the contents of the adjustment register 15 is programmable, the control of omission or suppression of timer update operations during various ones of the update cycles can be programmed to meet different requirements. For example, if the operating cycle time Tc' is 36 nanoseconds, the error occurring during one update cycle of 10 operating cycles is $\Delta T = Tu\text{-}Tu' = 1000 - (10 \times 36) = 640$ nanoseconds The actual elapsed time for one update cycle in this case is 360 nanoseconds.

If during the occurrence of 100 of these 360-nanosecond update cycles, 36 timer updates are made and 64 are suppressed, the timer registers will at the conclusion of these 100 update cycles show a time increase of 36 microseconds, since each update updates the time value by one microsecond. At the conclusion of this 100 update cycles, the actual elapsed time will be 100 times 360 nanoseconds, or 36 microseconds. This means that perfect adjustment or correction has been made. The omission of the timer updates has enabled the actual elapsed time to catch up with the indicated time showing on the face of the timers.

For the case of this 36-nanosecond operating cycle time, the 100 bit adjustment pattern in the adjustment register 15 can be composed of four blocks of 25 bits each. Each block would contain 16 suppress bits having a binary value of one and nine execute bits having a binary value of zero. The bit distribution in each block could be, for example, as follows:

0110101101011011011011011

This 25-bit block is repeated four times so that the total adjustment pattern of 100 bits in adjustment register 15 includes 64 suppress bits (1's) and 36 non-suppress bits (0's).

In a strict sense, the update cycles during which no updates are made are not really "update" cycles, since nothing is updated. However, this nomenclature is maintained for simplicity of explanation and the distinction is made between update cycles within which updating actually is executed and update cycles within which updating is omitted.

For the adjustment pattern shown above, updating is executed as usual during 36 out of the 100 update cycles. Since, at most, two suppress bits, each having an update cycle time of 360 nanoseconds, are arranged consecutively in the above 25-bit block, the maximum error at any given moment is 2×360 nanoseconds, or 0.72 microseconds. Thus, the maximum error is less than the one microsecond resolution of the timer. The time period after which exact adjustment is obtained is equal to the duration of the 25-bit block indicated above and is 25×360 nanoseconds, or 9.0 microseconds.

The number of bits needed in the adjustment pattern used in adjustment register 15 depends on the smallest error to be adjusted per operating cycle. This is the minimum of the difference between the desired operating cycle time Tc and the actual operating cycle time Tc' likely to be encountered. In particular, the necessary number P of control bits in the adjustment pattern is:

$$P = \frac{Iu}{Nu \times (Tc - Tc')_{min}}$$

where

P = number of bits (control bits) needed in adjustment pattern,
Iu = time increment represented by each update of a timer,
Nu = number of operating cycles per update cycle,
$(Tc - Tc')_{min}$ = minimum error per operating cycle.

For the case of a 99 nanosecond operating cycle (one nanosecond minimum error) with ten operating cycles per update cycle and a timer time increment value of 1000 nanoseconds, the number P of control bits required is 100.

The granularity of adjustment can be defined as the smallest possible actual operating cycle time period Tc' which can be adjusted. For the above example, where the desired update time increment is 1000 nanoseconds, the number of adjustment bits is 100 and the number of operating cycles per update cycle is 10, the granularity is one nanosecond. This means that the smallest possible actual operating cycle time Tc' which can be accounted for by adjustment is one nanosecond.

For the example given above, it was shown that 100 control bits are needed in the adjustment pattern. Thus, during 100 update cycles, at most 99 update suppress cycles could be included with one normal update execute cycle.

Figure 3:
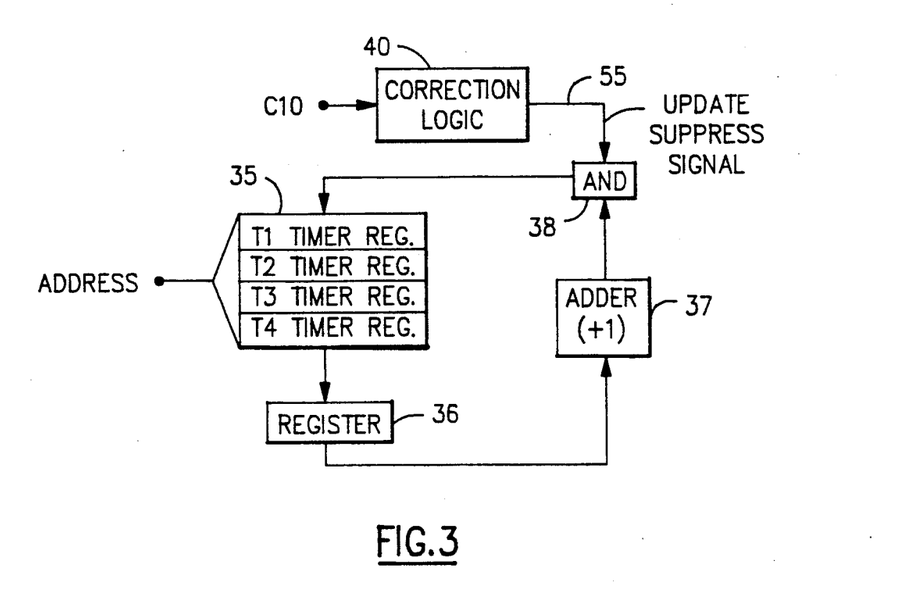
FIG. 3 is a block diagram showing a second embodiment of a timer mechanism constructed in accordance with the present invention.
Figure 4:
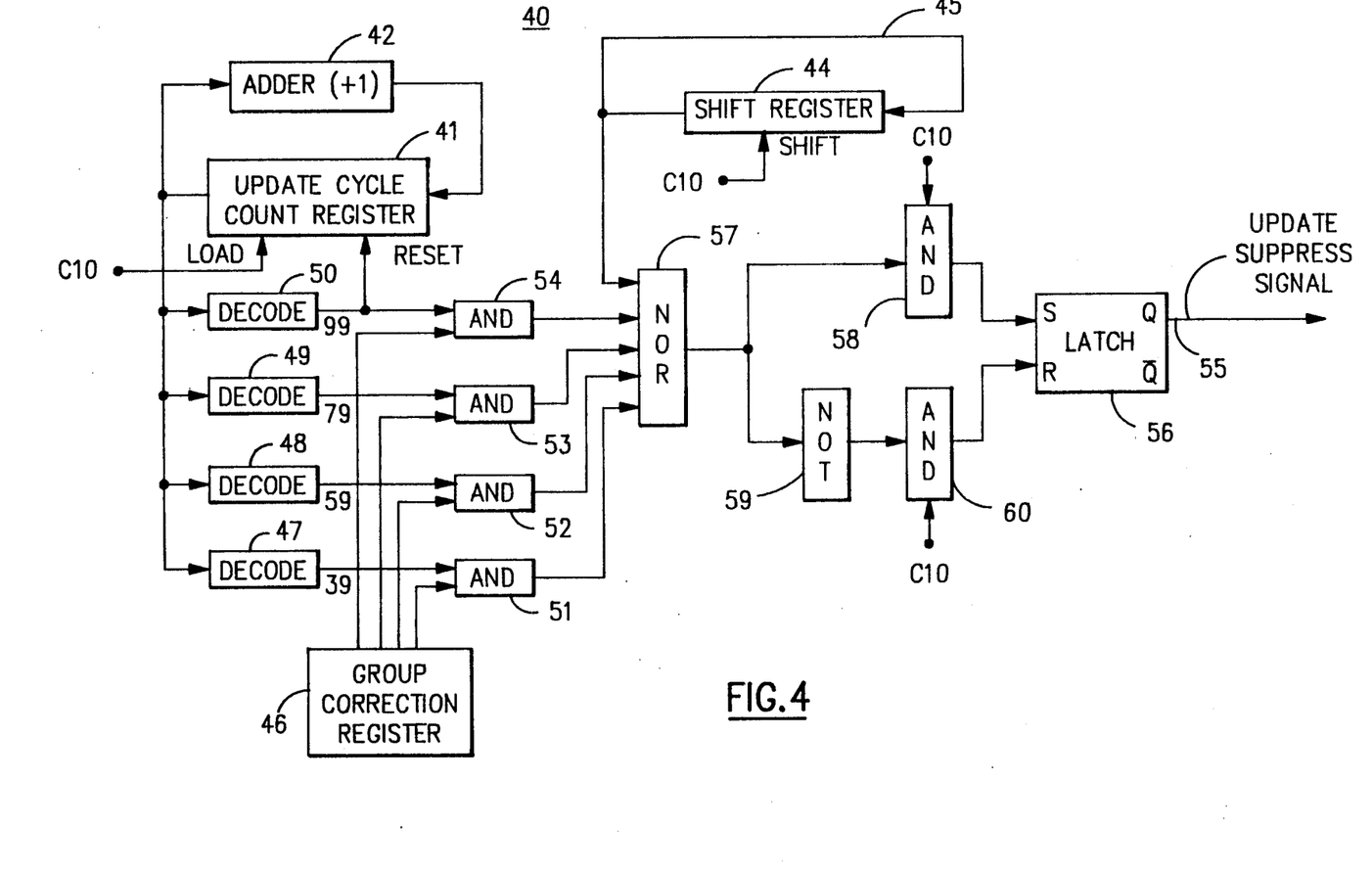
FIG. 4 shows in greater detail the internal construction of the correction logic unit of FIG. 3.

DESCRIPTION OF FIGS. 3 AND 4 TIMER MECHANISM

FIG. 3 shows another embodiment of a timer mechanism construct in accordance with the present invention and FIG. 4 shows in greater detail the internal construction of the correction logic of FIG. 3. With reference to FIG. 3, the timer mechanism thereshown includes a register array 35, an output buffer register 36, an adder 37 and an AND circuit 38, the output of which is connected back to the data input of the array 35. These elements, connected in the manner, shown provide a "counter" mechanism for "counting" the occurrences of a desired event, in this case the occurrences of the update cycles previously considered. These repetitive update cycles are assumed to individually represent a known increment of time, thereby enabling the counter mechanism to become a timer mechanism. The updating of the timer registers T1, T2, T3 and T4 occurs in the same manner as described in connection with FIG. 1.

The timer mechanism of FIG. 3 also includes correction logic 40 for causing the updating of the timer registers to be omitted or suppressed during selected update cycles. A binary zero level on the output line of correction logic 40 constitutes an update suppress signal and serves to disable the AND circuit 38 for the duration of one or more update cycles.

It is noted that the register array 35 in this embodiment does not include an adjustment register. The function of such an adjustment register is instead provided inside the correction logic 40.

The removal of the adjustment register function from the register array 35 enables a more practical value to be used for the width of the timer registers in array 35. In order to provide a more practical size for the adjustment register itself, it is also desirable to reduce the number of bits required for the adjustment register function to a smaller quantity. A novel way of doing this is to provide an adjustment or correction control field format in the manner shown in FIG. 5. In the example shown, the correction control field is 31 bits in length. As will be seen, this 31-bit control field provides the same update suppression capability as was provided by the 100-bit adjustment pattern described in connection with FIG. 1.

Figure 5:
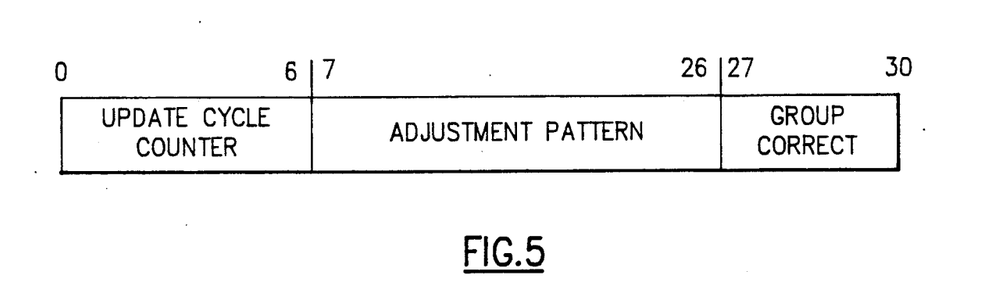
FIG. 5. shows a control field format which is used in the correction logic of FIG. 4.

The control field format of FIG. 5 includes a 7-bit (bits 0-6) update cycle counter field which is used to count the update cycles from 0 to 100. The format of FIG. 5 also includes a 20-bit adjustment pattern field (bit 7-26), the individual bits of which are used to control the updating operations. FIG. 5 also shows a 4-bit group correction field (bit 27-30) which is used in some applications to provide a more precise correction.

The number of bit positions in the adjustment pattern field shown in FIG. 5 is 20. This adjustment pattern of 20 bits would be sufficient if the number of suppres bits needed during 100 updates cycles is divisible by five. In such case, the 20 bit adjustment pattern would be read five times and the number of suppress bits included in this 20-bit pattern multiplied by five would result in the desired total number of suppres bits. In such case, the group correction field would not be needed.

Let it be assumed, however, that the number of suppress bits to be included during 100 timer update cycles is 64. If in the 20-bit adjustment pattern of FIG. 5, twelve suppress bits are included, then reading this adjustment pattern five times provides 60 suppress bits. This leaves a remainder of four suppress bits which are not accounted for. In this case the, group correction field of FIG. 5 enables these remaining four suppress bits to be provided.

More particularly, each time the 20-bit adjustment pattern is shifted by one bit position, the update cycle counter (bits 0-6) will count one step further. This counter is designed to count from 0 to 99 and to wrap back to 0 again following a count of 99. Four of the count values in this 0 to 99 range are selected and a particular one of the group correction bits is assigned to each selected counter value. Whenever one of these selected counter values is detected, the assigned group correction bit is looked at and if it has a binary one value, then a suppress bit is produced and used to suppress the updating of the timer registers during the next following update cycle. In this manner, anywhere from 0 to 4 additional suppress bits can be added by selecting four number values that may appear in the update cycle counter and assigning to each value one of the four group correction bits. A suppress bit is added each time one of these number values is reached if it's assigned group correction bit has a binary value of one. As can be appreciated, these number values must be selected such that these additional suppress bits do not coincide with suppress bits normally produced by the adjustment pattern field.

The correction logic 40 shown in FIG. 4 implements the correction control field format shown in FIG. 5. This correction logic 40 of FIG. 4 includes an update cycle count register 41 which is updated by a count of one at the end of each timer update cycle. This is accomplished by means of the adder 42 which adds a numerical value of one to the number appearing in the count register 41 and by the C10 clock pulse which loads the new number into the count register 41. Count register 41 is a 7-bit register. It is wrapped or reset to a zero value shortly after it is loaded with a numerical value of 99. Thus, this counter mechanism 41, 42 counts the number of updates cycles from 0 through 99 and then is automatically reset to repeat this process. The seven bits in count register 41 constitute the seven bits (bits 0-6) shown for the update cycle counter in FIG. 5.

The 20-bit adjustment pattern of FIG. 5 is located in a 20-bit shift register 44 shown in FIG. 4. A circularly shifting action is provided by connecting the output line of this shift register 44 back to its input terminal, this being accomplished by way of line 45. Thus, a bit shifted out of the left side of the register 44 is inserted back into the rightside of the register 44. Shift register 44 shifts the bit pattern therein one bit position to the left each time a C10 clock pulse is supplied to its shift control terminal. Thus, a one position shift occurs at the end of each timer update cycle.

A four-bit group correction register 46 is provided for the four bits in the group correction field of FIG. 5. Four predetermined and different count values in the count register 41 are selected by decoders 47-50. By way of example only, it is assumed that these decoders respectively select count values of 39, 59, 79 and 99. In this case, the output of decoder 50 is also used to reset the count register 41 shortly following the appearance of a count value of 99 therein. The assignment of different ones of the group correction bits in register 46 to different ones of the four count values selected by decoders 47-50 is accomplished by means of AND circuits 51-54.

If it's assigned group correction bit has a binary value of one, then the detection of its selected count value by a decoder will cause a binary one level signal to be produced at the output of its respective one of AND circuits 51-54. Thus, for example, if the group correction bit for decoder 47 has a binary value of one, then, when decoder 47 detects the occurrence of its assumed count value 39, a binary one signal is produced at the output of the corresponding AND circuit 51. In between the periodic occurrences of the count value 39, the output of decoder 47 is at a binary zero level, causing a zero level to also appear at the output of AND circuit 51. If the group correction bit assigned to decoder 47 has a binary value of zero, then AND circuit 51 is disabled. In this case, no one level will appear at the output of AND 51 even when the decoder 47 detects a count value of 39.

The update control signal for the timer mechanism of FIG. 3 is produced on the Q output line 55 of a set-reset latch 56. This output line 55 is at the binary one level when latch 56 is in a set state and is at a binary zero level when latch 56 is in a reset state.

A 5-input NOR circuit 57 is used to collect the outputs of the shift register 44 and the AND circuits 51-54 to provide a control signal which controls the setting and resetting of the latch 56. If any one or more of the inputs to the NOR circuit 57 are at the binary one level, then the output line of NOR 57 goes to the binary zero level. A one level at any of the inputs of NOR 57 indicates that an update cycle is to be suppressed.

The output of NOR circuit 57 is coupled by way of AND circuit 58 to the set (S) input of the latch 56. The output of NOR 57 is also coupled by way of a NOT circuit 59 and a second AND circuit 60 to the reset (R) input of latch 56. C10 clock pulses are supplied to the second inputs of AND 58 and AND 60. If the output line of NOR 57 is at the binary one level (no suppress of timer update), then the C10 pulse is passed by AND 58 to switch the latch 56 to the set mode if it is not already in that mode. If, on the other hand, the output line of NOR 57 is at the zero level (suppress timer update), this zero level is inverted by NOT 59 to enable the AND 60 to pass the C10 pulse to the reset (R) input of latch 56 to switch latch 56 to the reset mode if it is not already in that mode. Since the C10 clock pulse occurs at the end of the update cycle, this means that timer updating will be allowed to occur during the next update cycle if latch 56 is in the set mode and will be suppressed if latch 56 is in the reset mode. If latch 56 is in the reset mode (output line 55 at binary zero level), then updating of timer registers T1-T4 will be omitted or suppressed during this next update cycle. This occurs because the binary zero level on latch output line 55 acts to disable the AND circuit 38 of FIG. 3 and this condition prevails until at least the end of this next update cycle.

The correction logic 40 of FIG. 4 is readily programmable to accommodate the particular application at hand. As part of the initial startup or setup of the data processing system, the desired adjustment pattern is loaded into the shift register 44, the desired group correction pattern is loaded into the group correction register 46 and the update cycle count register 41 is reset to a zero value. During this initial startup procedure, latch 56 is set to the set mode if updating is to allowed during the first update cycle and is set to the reset mode if updating is to be suppressed during the first update cycle. After this initial setup, the correction logic 40 operates automatically to provide the desired time adjustments or corrections throughout the remainder of the data processing system operating session.

DESCRIPTION OF FURTHER TIMER MECHANISM

Figure 6:
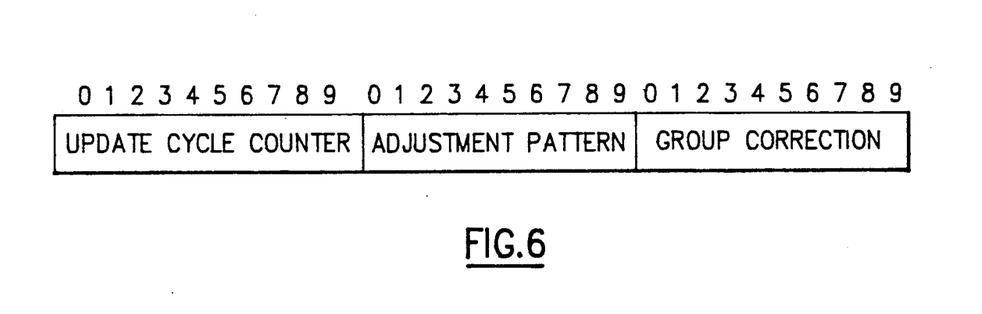
FIG. 6 shows a control field format used in a further embodiment of the invention.

In some applications, a further simplification can be achieved by using the correction control field format shown in FIG. 6. As there shown, there are 30 bits in three fields, with 10 bits in each field. The first field is used to provide an update cycle counter, the second field provides the adjustment pattern and the third field provides the group correction pattern.

The 10-bit adjustment pattern is used as described above, that is, with each update cycle, the adjustment pattern field is made to circularly shift to the left by one bit position. The bit at the leftmost position is written into the rightmost position, while all other bits are shifted by one position to the left. The appearance of a binary one value in the leftmost bit position indicates that update suppression is need and that updating of the timers is to be omitted during the corresponding update cycle.

The 10-bit update cycle counter defines a decimal carry. If, for example, the number of suppress bits is 64, the decimal carry to be defined in the counter field is six. This is indicated by a binary one value in bit position 6, with the values at all other bit positions having a binary value of zero. This update cycle counter is circularly shifted to the left by one bit position per each update cycle, the same as is the adjustment pattern field. Each time a binary one value appears at the leftmost bit position of the update cycle counter, the leftmost bit of the group correction field is looked at and used to control the timer updating action. If the leftmost bit of the group correction field has a binary one value, timer updating is omitted or suppressed for one update cycle.

Each time the update cycle counter field has been circularly shifted once completely (once every ten update cycles), the group correction field is circularly shifted by one bit position to the left. In the example given above in which the timer update is to be suppressed for 64 update cycles, four bits having a binary one value are included in the group correction field, the other bits being given a binary zero value.

This arrangement of FIG. 6 has the advantage over the arrangement of FIG. 4 in that no decoding is necessary and for all three field patterns in the correction control field format, only circular shift operations are carried out. For some applications, this approach may provide greater flexibility or simplify the implementation or both.

SUMMARY

As is understood by those skilled in the art, the foregoing embodiments may be implemented in software, as opposed to hardware, or in some combination of software and hardware. In the FIG. 1 embodiment, for example, registers 11–15 and 17 may be either general purpose type or utility type registers in a digital data processor. Or they may be software created registers in the processor storage unit. Software routines or instructions may be provided for performing the adding function of adder 20, the bit shifting function of shifter 24 and the other necessary functions. Thus it is intended that the appended claims should equally cover hardware embodiments, software embodiments and mixed hardware/software embodiments of the present invention.

While there have been described what are at present considered to be preferred embodiments of this invention, it will be obvious to those skilled in the art that various changes and modifications may be made therein without departing from the invention, and it is, therefore, intended to cover all such changes and modifications as fall within the true spirit and scope of the invention.

What is claimed is:

1. A method for maintaining a time value in a digital system which generates periodic clock signals, said time value being updatable in increments, said method comprising the steps of:

generating periodic timing signals based on said clock signals, the timing signal period being shorter than the time value increment, said timing signal period being an integral multiple of the clock signal period but said clock signal period not being an integral submultiple of the time value increment;

providing a shift register which has a multiplicity of actual bit positions, said shift register circulating binary control bits through said actual bit positions one or more actual cycles per shift register cycle to yield a total number of actual bit position shifts per shift register cycle such that a combined duration of said total number of said timing signal periods is an integral multiple of said time value increment;

loading a first number of said actual bit positions of said shift register with control bits of a first binary level and loading a second number of said actual bit positions of said shift register with control bits of a second binary level, a combined duration of said total number of said timing signal periods being equal to said second number times said time value increment;

shifting said shift register with each of said periodic timing signals;

incrementing said time value each time a control bit of said second binary level is shifted to a certain position in said shift register; and preventing said time value from being incremented each time a control bit of said first binary level is shifted to said certain position in said shift register, whereby when said total number of timing signals has occurred the resultant time value equals the combined duration of said total number of timing signal periods.

2. A method in accordance with claim 1 wherein said total number of actual bit position shifts per shift register cycle is equal to a number of actual bit positions in said shift register which store said control bits that increment or prevent incrementing of said time value.

3. A method in accordance with claim 1 wherein said total number of bit position shifts per shift register cycle is an integral multiple greater than one of a number of actual bit positions in said shift register which store said control bits that increment or prevent incrementing of said time value, and each of said control bits in said actual bit positions is circularly shifted a plurality of actual cycles through said shift register during each shift register cycle such that each of said control bits increments or prevents incrementing of said time value a plurality of times per shift register cycle.

4. A method in accordance with claim 3 wherein
said circulation of said control bits the plurality of actual cycles per shift register cycle results in a time value which approximates the combined duration of a number of timing signal periods, which number is equal to a number of actual bit positions times the plurality of actual cycles that said control bits are circularly shifted per shift register cycle; and
said shift register further comprises additional actual bit positions which store additional control bits of said second and first binary levels that increment or prevent incrementing, respectfully, of said time value, the additional control bits being circularly shifted a different number of actual cycles than said plurality during each of said shift register cycles such that each of said additional control bits increments or prevents incrementing of said time value said different number of times per shift register cycle and at the end of said shift register cycle said time value equals a combined duration of a total number of shifts in said shift register cycle times the timing signal period.

5. A method in accordance with claim 4 wherein said different number is one.

6. A method in accordance with claim 1 wherein said first number is an integer greater than one, said second number is an integer greater than one and said control bits of said first binary level are interspersed with said control bits of said second binary level in said shift register.

7. A digital system which generates periodic clock signals and maintains a time value, said time value being updatable in increments, said system comprising:
means for generating periodic timing signals based on said clock signals, the timing signal period being shorter than the time value increment, said timing signal period being an integral multiple of the clock signal period but said clock signal period not being an integral submultiple of the time value increment;
a shift register which has a multiplicity of actual bit positions, said shift register circulating binary control bits through said actual bit positions one or more actual cycles per shift register cycle to yield a total number of actual bit position shifts per shift register cycle such that a combined duration of said total number of said timing signal periods is an integral multiple of said time value increment; and
means for loading a first number of said actual bit positions of said shift register with control bits of a first binary level and loading a second number of said actual bit positions of said shift register with control bits of a second binary level, a combined duration of said total number of said timing signal periods being equal to said second number times said time value increment; and wherein
said shift register is coupled to the generating means to receive said periodic timing signals and is shifted with each of said periodic timing signals; and further comprising
means for incrementing said time value each time a control bit of said second binary level is shifted to a certain position in said shift register whereby when said total number of timing signals has occurred the resultant time value equals the combined duration of said total number of timing signal periods.

8. A system in accordance with claim 7 wherein said total number of actual bit position shifts per shift register cycle is equal to a number of actual bit positions in said shift register which store said control bits of said first and second binary levels.

9. A system in accordance with claim 7 wherein said total number of bit position shifts per shift register cycle is an integral multiple greater than one of a number of actual bit positions in said shift register which store said control bits of said first and second binary levels, and each of said control bits in said actual bit positions is circularly shifted a plurality of actual cycles through said shift register during each shift register cycle such that each of said control bits of said second binary level increments said time value a plurality of times per shift register cycle.

10. A system in accordance with claim 9 wherein
said circulation of said control bits the plurality of actual cycles per shift register cycle results in a time value which approximates the combined duration of a number of timing signal periods, which number is equal to a number of said actual bit positions times the plurality of actual cycles that said control bits are circularly shifted per shift register cycle; and
said shift register further comprises additional actual bit positions which store additional control bits of said first and second binary levels, the additional control bits being circularly shifted a different number of actual cycles than said plurality during each of said shift register cycles such that each of said additional control bits of said second binary level increments said time value said different number of times per shift register cycle and at the end of said shift register cycle said time value equals the duration of a total number of shifts in said shift register cycle times the timing signal period.

11. A system in accordance with claim 10 wherein said different number is one.

12. A system in accordance with claim 7 wherein said first number is an integer greater than one, said second number is an integer greater than one and said control bits of said first binary level are interspersed with said control bits of said second binary level in said shift register.

* * * * *